US008309955B2

(12) United States Patent
Katz et al.

(10) Patent No.: US 8,309,955 B2
(45) Date of Patent: Nov. 13, 2012

(54) DEVICES HAVING HIGH DIELECTRIC CONSTANT, IONICALLY-POLARIZABLE MATERIALS

(75) Inventors: Howard Edan Katz, Baltimore, MD (US); Bhola Nath Pal, Baltimore, MD (US); Kevin Cua See, Baltimore, MD (US)

(73) Assignee: The Johns Hopkins University, Baltimore, MD (US)

( * ) Notice: Subject to any disclaimer, the term of this patent is extended or adjusted under 35 U.S.C. 154(b) by 237 days.

(21) Appl. No.: 12/743,764

(22) PCT Filed: Jan. 7, 2009

(86) PCT No.: PCT/US2009/030328
§ 371 (c)(1),
(2), (4) Date: May 19, 2010

(87) PCT Pub. No.: WO2009/108397
PCT Pub. Date: Sep. 3, 2009

(65) Prior Publication Data
US 2010/0283042 A1    Nov. 11, 2010

Related U.S. Application Data

(60) Provisional application No. 61/010,289, filed on Jan. 7, 2008.

(51) Int. Cl.
*H01L 29/08* (2006.01)
(52) U.S. Cl. .......................................... 257/40; 438/82
(58) Field of Classification Search .................... 257/40; 438/82
See application file for complete search history.

(56) References Cited

U.S. PATENT DOCUMENTS

| 7,067,871 B2 * | 6/2006 | Ozawa .......................... 257/315 |
| 2006/0060852 A1 | 3/2006 | Yamazaki et al. |
| 2007/0117007 A1 | 5/2007 | Visco et al. |

OTHER PUBLICATIONS

International Search Report and Written Opinion dated Jul. 9, 2009, issued in priority International Application No. PCT/US2009/030328.
Brennan et al., "Signal frequency identification using anisotropic propagation characteristics of capacitively tuned L-C grids", Electronics Letters 42, 981 (2006).
Chaivipas et al., "Spatial sensitivity of capacitors in distributed resonators and its application to fine and wide frequency tuning digital controlled oscillators", Ieice Transactions on Electronics E91C, 918 (2008).
Chang et al., "High-performance, spin-coated zinc tin oxide thin-film transistors", Electrochemical and Solid State Letters 10, H135 (2007).
Chen et al., "Effect of metal-polymer interface on the breakdown electric field of poly(vinylidene fluoride-trifluoroethylene-chlorofluoroethylene) terpolymer", Applied Physics Letters 91 (2007).

(Continued)

*Primary Examiner* — Douglas Menz
(74) *Attorney, Agent, or Firm* — Venable LLP; Henry J. Daley

(57) ABSTRACT

An electronic or electro-optic device has a first electrode, a second electrode spaced apart from the first electrode, and a dielectric layer disposed between the first and second electrodes. The dielectric layer has electrically insulating planar layers with intercalated ions therebetween such that the electrically insulating planar layers provide a barrier to impede movement of the intercalated ions to the first and second electrodes under an applied voltage while permitting a polarization of the dielectric layer while in operation.

19 Claims, 12 Drawing Sheets

OTHER PUBLICATIONS

Chen et al., "High field tunneling as a limiting factor of maximum energy density in dielectric energy storage capacitors", Applied Physics Letters 92 (2008).

Choi et al., "Solution-processed indium-zinc oxide transparent thin-film transistors", Electrochemical and Solid State Letters 11, H7 (2008).

Chu et al., "A dielectric polymer with high electric energy density and fast discharge speed", Science 313, 334 (2006).

Chung et al., "Influence of dipolar interactions on the conduction mechanism of Litbeta-alumina: Molecular Dynamics study", Solid State Ionics 176, 599 (2005).

Claude et al., "Electrical storage in poly(vinylidene fluoride) based ferroelectric polymers: Correlating polymer structure to electrical breakdown strength", Chemistry of Materials 20, 2078 (2008).

Drozcl et al., "A capacitively loaded half-wavelength tapped-stub resonator", Ieee Transactions on Microwave Theory and Techniques 45, 1100 (1997).

Edon et al., "Structural and electrical properties of the interfacial layer in sputter deposited LaAlO3/Si thin films", Thin Solid Films 515, 7782 (2007).

Funke and Banhatti, (2007), p. 1942.

Garcia et al., "Effect of pore morphology on the electrochemical properties of electric double layer carbon cryogel supercapacitors", Journal of Applied Physics 104 (2008).

Goel et al., "High-indium-content InGaAs metal-oxide-semiconductor capacitor with amorphous LaAlO3 gate dielectric", Applied Physics Letters 91 (2007).

Goto et al., "Application of Sr beta-alumina solid electrolyte to a CO2 gas sensor", Solid State Ionics 156, 329 (2003).

He et al., "Optical and electrical properties of plasma-oxidation derived Hf02 gate dielectric films", Applied Surface Science 253, 3413 (2007).

Hoffman et al., "ZnO-based transparent thin-film transistors", Applied Physics Letters 82, 733 (2003).

Hong et al., High-Performance Ceramics 2001, Proceedings, edited by J. P. W. Gong, 2002, vol. 224-2, p. 183.

Huang et al., "Significantly enhanced charge conduction in electric double layer capacitors using carbon nanotube-grafted activated carbon electrodes", Journal of Power Sources 183, 406 (2008).

Hui et al., "A brief review of the ionic conductivity enhancement for selected oxide electrolytes", Journal of Power Sources 172, 493 (2007).

Jayaraman et al., "Influence of the preparative conditions on the precursor phases formed during the synthesis of beta-alumina by the wet chemical gel to crystallite conversions", Materials Chemistry and Physics 52, 46 (1998).

Jayaraman et al., "Preparation of lithium B-alumina by the ion-exchange reaction", Materials Research Bulletin 33, 1811 (1998).

Jayaraman et al., "Preparation of potassium beta aluminas by gel-to-crystallite conversion and their characterisation", Journal of Materials Chemistry 8, 1087 (1998).

Jeong et al., "Comprehensive study on the transport mechanism of amorphous indium-gallium-zinc oxide transistors", Journal of the Electrochemical Society 155, H873 (2008).

Jeong et al., "Solution-processed zinc tin oxide semiconductor for thin-film transistors", Journal of Physical Chemistry C 112, 11082 (2008).

Juodkazis et al., "On the charge storage mechanism at Ru02/0.5 M H2SO4 interface", Journal of Solid State Electrochemistry 12, 1399 (2008).

Kamishima et al., "Defect modes around low-lying phonon in Ag beta-alumina by Raman scattering with high resolution", Solid State Ionics 179, 780 (2008).

Kattamis et al., "Active-matrix organic light-emitting displays employing two thin-film-transistor a-Si: H pixels on flexible stainless-steel foil", Journal of the Society for Information Display 15, 433 (2007).

Kim et al., "Growth of heteroepitaxial ZnO thin films on GaN-Buffered A1203(0001) substrates by low-temperature hydrothermal synthesis at 90 degrees C", Advanced Functional Materials 17, 463 (2007).

Kim et al., "High performance solution-processed indium oxide thin-film transistors", Journal of the American Chemical Society 130, 12580 (2008).

Kim et al., "New architecture for high-efficiency polymer photovoltaic cells using solution-based titanium oxide as an optical spacer", Advanced Materials 18, 572 (2006).

Klauk et al., "Low-voltage organic thin-film transistors with large transconductance", Journal of Applied Physics 102 (2007).

Lecars et al., "Nonstoichiometry and Stability of Beta and Beta Alumina", Comptes Rendus Hebdomadaires Des Seances De L Academie Des Sciences Serie C 274, 4 (1972).

Lee et al., "A general route to printable high-mobility transparent amorphous oxide semiconductors", Advanced Materials 19, 843 (2007).

Lee et al., "Compact models based on transmission-line concept for integrated capacitors and inductors", Ieee Transactions on Microwave Theory and Techniques 54,4141 (2006).

Lee et al., "Efficacy of TiOx optical spacer in bulk-heterojunction solar cells processed with 1,8-octanedithiol", Applied Physics Letters 92 (2008).

Li et al., "Performance improvement for solution-processed high-mobility ZnO thin-film transistors", Journal of Physics D-Applied Physics 41 (2008).

Li et al., "ZnO field-effect transistors prepared by aqueous solution-growth ZnO crystal thin film", Journal of Applied Physics 102 (2007).

Lim et al., "High performance indium gallium zinc oxide thin film transistors fabricated on polyethylene terephthalate substrates", Applied Physics Letters 93 (2008).

Lin et al., "Interfacial properties of Zr02 on silicon", Journal of Applied Physics 93, 5945 (2003).

McDowell et al., "Combinatorial study of zinc tin oxide thin-film transistors", Applied Physics Letters 92 (2008).

Nafe et al., "The equilibrium between Na-beta- and Na-beta -alumina as a function of the phase composition", Electrochimica Acta 45, 1631 (2000).

Nandi et al., "Investigations on Ta205/ZnO insulator-semiconductor interfaces", Electronics Letters 38, 1390 (2002).

Natsume et al., "Zinc oxide films prepared by sol-gel spin-coating", Thin Solid Films 372, 30 (2000).

Nayak et al., "Cobalt hydroxide as a capacitor material: Tuning its potential window", Journal of the Electrochemical Society 155, A855 (2008).

Norris et al., "Spin-coated zinc oxide transparent transistors", Journal of Physics D-Applied Physics 36, L105 (2003).

Oh et al., "Preparation and electrochemical characterization of porous SWNT-PPy nanocomposite sheets for supercapacitor applications", Synthetic Metals 158, 638 (2008).

Ong et al., "Stable, solution-processed, high-mobility ZnO thin-film transistors", Journal of the American Chemical Society 129, 2750 (2007).

Ozgur et al., "A comprehensive review of ZnO materials and devices", Journal of Applied Physics 98 (2005).

Pal et al., "Pentacene-zinc oxide vertical diode with compatible grains and 15-MHz rectification", Advanced Materials 20, 1023 (2008).

Pal et al., "Solution-deposited zinc oxide and zinc oxide/pentacene bilayer transistors: High mobility n-channel, ambipolar and nonvolatile devices", Advanced Functional Materials 1 8, 1832 (2008).

Pech et al., "Concept for charge storage in electrochemical capacitors with functionalized carbon electrodes", Electrochemical and Solid State Letters 11, A202 (2008).

Rabuffi et al., "Status quo and future prospects for metallized polypropylene energy storage capacitors", IEEE Transactions on Plasma Science 30, 1939 (2002).

Robertson, "High dielectric constant oxides", European Physical Journal-Applied Physics 28, 265 (2004).

Sartori et al., "Contact Free Conductivity of Layered Materials—Na Beta-alumina", Journal of Applied Physics 50, 5761 p. 911 (1979).

Sattar et al., "Synthesis of divalent and trivalent Beta"-Aluminas by Ion-exchange, Journal of Solid State Chemistry 65, 231 (1936).

Schafer et al., "Preparation of Divalent Beta-alumina Ceramics via [on-exchange from K-Alumina and Na-Beta-Alumina Cermaics", Solid State Ionics 53-6, 559 (1992).

Shaijumon et al., "Synthesis of hybrid nanowire arrays and their application as high power supercapacitor electrodes", Chemical Communications, 2373 (2008).

Sharma et al., "Manganese oxide embedded polypyrrole nanocomposites for electrochemical supercapacitor", Electrochimica Acta 53, 7690 (2008).

Shiu et al., "1 nm equivalent oxide thickness in $Ga_2O_3(Gd_2O_3)/In_{0.2}Ga_{0.8}As$ metal-oxide-semiconductor capacitors", Applied Physics Letters 92 (2008).

Shqau et al., "Thermodynamic stability of potassium-beta-alumina", Journal of the American Ceramic Society 88, 2894 (2005).

Strom et al., "Electrical-conductivity Spectrum of Na Beta Alumina from 109 to 1013 HZ", Bulletin of the American Physical Society 20, 330 (1975).

Subasri et al., "Microwave processing of sodium beta alumina", Solid State Ionics 158, 199 (2003).

Sudworth et al., "Toward commercialization of the beta-alumina family of ionic conductors", Mrs Bulletin 25, 22 (2000).

Thangadurai et al., "Recent progress in solid oxide and lithium ion conducting electrolytes research", Ionics 12, 81 (2006).

Tietz et al., "Lanthanide Ion-exchange in Sodium,-Beta-Alumina", Solid State Ionics 46, 331 (1991).

Tsipis et al., "Electrode materials and reaction mechanisms in solid oxide fuel cells: a brief review", Journal of Solid State Electrochemistry 12, 1039 (2008).

Vandecruys et al., "Thermodynamic activity of Na2O in Na beta-alumina", Materials Research Bulletin 35, 1153 (2000).

Whitting et al., "Inherent Transport Properties of Beta-alumina Family", Journal of the Electrochemical Society 119, 2109 (1972).

Whitting et al., "Measurement of Sodium Ion Transport in Beta Alumina using Reversible Solid Electrodes", Journal of Chemical Physics 54, 414 (1971).

Wong et al., "On the scaling issues and high-kappa replacement of ultrathin gate dielectrics for nanoscale MOS transistors", Microelectronic Engineering 83, 1867 (2006).

Wu et al., "Complementary metal-oxide-semiconductor thin-film transistor circuits from a high-temperature polycrystalline silicon process on steel foil substrates", IEEE Transactions on Electron Devices 49, 1993 (2002).

Wu et al., "High electron mobility polycrystalline silicon thin-film transistors on steel foil substrates", Applied Physics Letters 75, 2244 (1999).

Wu, "Development of high-k gate dielectric materials", Journal of Inorganic Materials 23, 865 (2008).

Yoldas, "Alumina Gels that form Porous Transparent $Al_2O_3$", Journal of Materials Science 10, 1856 (1975).

Yoldas, "Alumina Sol Preparation from Alkoxides", American Ceramic Society Bulletin 54, 289 (1975).

Yoldas, "Transparent Porous Alumina", American Ceramic Society Bulletin 54, 286 (1975).

Yuan et al., "High-voltage aqueous symmetric electrochemical capacitor based on $Ru_{0.7}Sn_{0.3}O_2$ center dot $nH_2O$ electrodes in 1 M KOH", Journal of Solid State Electrochemistry 12, 1645 (2008).

Zang et al., "Well-aligned cone-shaped nanostructure of polypyrrole/$RuO_2$ and its electrochemical supercapacitor", Journal of Physical Chemistry C 112, 14843 (2008).

Zhang et al., "Electrical conductivity and ionic transport number of Sr beta-alumina single crystals prepared by a floating zone method", Solid State Ionics 176, 2319 (2005).

Zhang et al., "Polyaniline nanofibers prepared by a facile electrochemical approach and their supercapacitor performance", Journal of Materials Research 23, 2326 (2008).

Zhang et al., "The structure-property relationship of poly(vinylidene difluoride)-based polymers with energy storage and loss under applied electric fields", Macromolecules 40, 9391 (2007).

* cited by examiner

DEVICES HAVING HIGH DIELECTRIC CONSTANT, IONICALLY-POLARIZABLE MATERIALS

CROSS-REFERENCE TO RELATED APPLICATION

This application is a National Stage Application of International Application No. PCT/US2009/030328 filed Jan. 7, 2009, which claims priority to U.S. Provisional Application No. 61/010,289 filed Jan. 7, 2008, the entire contents of both of which are hereby incorporated by reference in their entirety.

This invention was made using U.S. Government support under AFOSR Grant No. FA9550-06-1-0076 and DOE Grant No. 37420-001-06. The U.S. Government has certain rights in this invention.

BACKGROUND

1. Field of Invention

The current invention relates to electronic and/or electro-optic devices, and more particularly to electronic and/or electro-optic devices that include high dielectric-constant, ionically-polarizable materials.

2. Discussion of Related Art

There are numerous approaches to high-capacitance devices including high-dielectric constant (high-$\in$) insulators, ultrathin dielectric films, and/or high surface area electrodes. In silicon electronics, $SiO_2$ gate dielectrics that capacitively couple gate voltages to the formation of semiconductor charge carrier channels were shrunk to just a few monolayers before reaching a fundamental breakdown limit; as a result, higher-$\in$ $HfO_2$ was introduced as a replacement. (S. Duenas, H. Castan, H. Garcia, A. Gomez, L. Bailon, M. Toledano-Luque, I. Martil, and G. Gonzalez-Diaz, Electrical properties of high-pressure reactive sputtered thin hafnium oxide high-k gate dielectrics, Semiconductor Science and Technology 22, 1344 (2007); G. He, L. Q. Zhu, M. Liu, Q. Fang, and L. D. Zhang, Optical and electrical properties of plasma-oxidation derived HfO2 gate dielectric films, Applied Surface Science 253, 3413 (2007); H. Wong and H. Iwai, On the scaling issues and high-kappa replacement of ultrathin gate dielectrics for nanoscale MOS transistors, Microelectronic Engineering 83, 1867 (2006); D. Q. Wu, H. S. Zhao, J. C. Yao, D. Y. Zhang, and A. M. Chang, Development of high-k gate dielectric materials, Journal of Inorganic Materials 23, 865 (2008).) For energy storage, double-layer capacitors utilize the self-limiting thickness of polarized ionic assemblies in solution along with high surface area electrodes made from metallic solids and/or high surface area carbons. (B. B. Garcia, A. M. Feaver, Q. F. Zhang, R. D. Champion, G. Z. Cao, T. T. Fister, K. P. Nagle, and G. T. Seidler, Effect of pore morphology on the electrochemical properties of electric double layer carbon cryogel supercapacitors, Journal of Applied Physics 104 (2008); C. W. Huang, C. M. Chuang, J. M. Ting, and H. S. Teng, Significantly enhanced charge conduction in electric double layer capacitors using carbon nanotube-grafted activated carbon electrodes, Journal of Power Sources 183, 406 (2008); K. Juodkazis, J. Juodkazyte, V. Sukiene, A. Grigucevicience, and A. Selskis, On the charge storage mechanism at RuO2/0.5 M H2SO4 interface, Journal of Solid State Electrochemistry 12, 1399 (2008); D. Pech, D. Guay, T. Brousse, and D. Belanger, Concept for charge storage in electrochemical capacitors with functionalized carbon electrodes, Electrochemical and Solid State Letters 11, A202 (2008); M. M. Shaijumon, F. S. Ou, L. J. Ci, and P. M. Ajayan, Synthesis of hybrid nanowire arrays and their application as high power supercapacitor electrodes, Chemical Communications, 2373 (2008); C. Z. Yuan, H. Dou, B. Gao, L. H. Su, and X. G. Zhang, High-voltage aqueous symmetric electrochemical capacitor based on Ru0.7Sn0.3O2 center dot nH(2)O electrodes in 1 M KOH, Journal of Solid State Electrochemistry 12, 1645 (2008).) The combination of double layer formation and redox processes at the electrode surfaces, which can involve the metallic species or conductive polymer adlayers, leads to a synergistic effect known as supercapacitance. (P. K. Nayak and N. Munichandraiah, Cobalt hydroxide as a capacitor material: Tuning its potential window, Journal of the Electrochemical Society 155, A855 (2008); J. Oh, M. E. Kozlov, B. G. Kim, H. K. Kim, R. H. Baughman, and Y. H. Hwang, Preparation and electrochemical characterization of porous SWNT-PPy nanocomposite sheets for supercapacitor applications, Synthetic Metals 158, 638 (2008); R. K. Sharma, A. C. Rastogi, and S. B. Desu, Manganese oxide embedded polypyrrole nanocomposites for electrochemical supercapacitor, Electrochimica Acta 53, 7690 (2008); J. F. Zang, S. J. Bao, C. M. Li, H. J. Bian, X. Q. Cui, Q. L. Bao, C. Q. Sun, J. Guo, and K. R. Lian, Well-aligned cone-shaped nanostructure of polypyrrole/RuO2 and its electrochemical supercapacitor, Journal of Physical Chemistry C 112, 14843 (2008); H. B. Zhang, H. L. Li, F. B. Zhang, J. X. Wang, Z. Wang, and S. C. Wang, Polyaniline nanofibers prepared by a facile electrochemical approach and their supercapacitor performance, Journal of Materials Research 23, 2326 (2008).) In another alternative, flexible capacitive sheets with highly nonpolar or ferroelectric polymeric dielectrics (Q. Chen, B. J. Chu, X. Zhou, and Q. M. Zhang, Effect of metal-polymer interface on the breakdown electric field of poly(vinylidene fluoride-trifluoroethylene-chlorofluoroethylene) terpolymer, Applied Physics Letters 91 (2007); Q. Chen, Y. Wang, X. Zhou, Q. M. Zhang, and S. H. Zhang, High field tunneling as a limiting factor of maximum energy density in dielectric energy storage capacitors, Applied Physics Letters 92 (2008); B. J. Chu, X. Zhou, K. L. Ren, B. Neese, M. R. Lin, Q. Wang, F. Bauer, and Q. M. Zhang, A dielectric polymer with high electric energy density and fast discharge speed, Science 313, 334 (2006); J. Claude, Y. Y. Lu, K. Li, and Q. Wang, Electrical storage in poly(vinylidene fluoride) based ferroelectric polymers: Correlating polymer structure to electrical breakdown strength, Chemistry of Materials 20, 2078 (2008); M. Rabuffi and G. Picci, Status quo and future prospects for metallized polypropylene energy storage capacitors, IEEE Transactions on Plasma Science 30, 1939 (2002); Z. C. Zhang and T. C. M. Chung, The structure-property relationship of poly(vinylidene difluoride)-based polymers with energy storage and loss under applied electric fields, Macromolecules 40, 9391 (2007)) flanked by metal coatings are coiled to increase capacitance per unit volume. Consequently, there remains a need for electronic and/or electro-optic devices that have improved dielectric structures.

SUMMARY

An electronic or electro-optic device according to an embodiment of the current invention has a first electrode, a second electrode spaced apart from the first electrode, and a dielectric layer disposed between the first and second electrodes. The dielectric layer has electrically insulating planar layers with intercalated ions therebetween such that the electrically insulating planar layers provide a barrier to impede movement of the intercalated ions to the first and second electrodes under an applied voltage while permitting a polarization of the dielectric layer while in operation.

BRIEF DESCRIPTION OF THE DRAWINGS

Additional features of this invention are provided in the following detailed description of various embodiments of the invention with reference to the drawings. Furthermore, the above-discussed and other attendant advantages of the present invention will become better understood by reference to the detailed description when taken in conjunction with the accompanying drawings, in which.

DETAILED DESCRIPTION OF VARIOUS EMBODIMENTS

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited herein are incorporated by reference as if each had been individually incorporated.

There are extensive research programs aimed at the development and use of ionic conductors for batteries and fuel cells in which the migration of ions through a solid contributes to direct current in a power circuit. (S. Q. Hui, J. Roller, S. Yick, X. Zhang, C. Deces-Petit, Y. S. Xie, R. Maric, and D. Ghosh, A brief review of the ionic conductivity enhancement for selected oxide electrolytes, Journal of Power Sources 172, 493 (2007); V. Thangadurai and W. Weppner, Recent progress in solid oxide and lithium ion conducting electrolytes research, Ionics 12, 81 (2006); E. V. Tsipis and V. V. Kharton, Electrode materials and reaction mechanisms in solid oxide fuel cells: a brief review, Journal of Solid State Electrochemistry 12, 1039 (2008).) However, devices conventionally utilize these materials as electrolytes and do not recognize that materials that have intercalated ions between electrically insulating planes can exhibit desirable dielectric properties for use as dielectric structures in electronic and/or electro-optic devices. The conventional conductor circuits rely on ions entering and exiting the solid, exchanging with other circuit elements. However, in cases where the ions cannot migrate into and out of a solid at as fast a rate or in as large a quantity as electrons or holes in an external circuit, they become positionally polarized within the solid by electric fields and thus contribute to capacitance, not DC conductivity. The mechanism of ionic motion within an ionic conductor can therefore lead to either capacitance or conductivity depending on the ability of electrodes to accept and inject the ions, and the time scale of the observation. Therefore, according to some embodiments of the current invention, ionic conductors are used as ionically polarizable dielectric insulators with enhanced energy storage ability.

Figure 1:
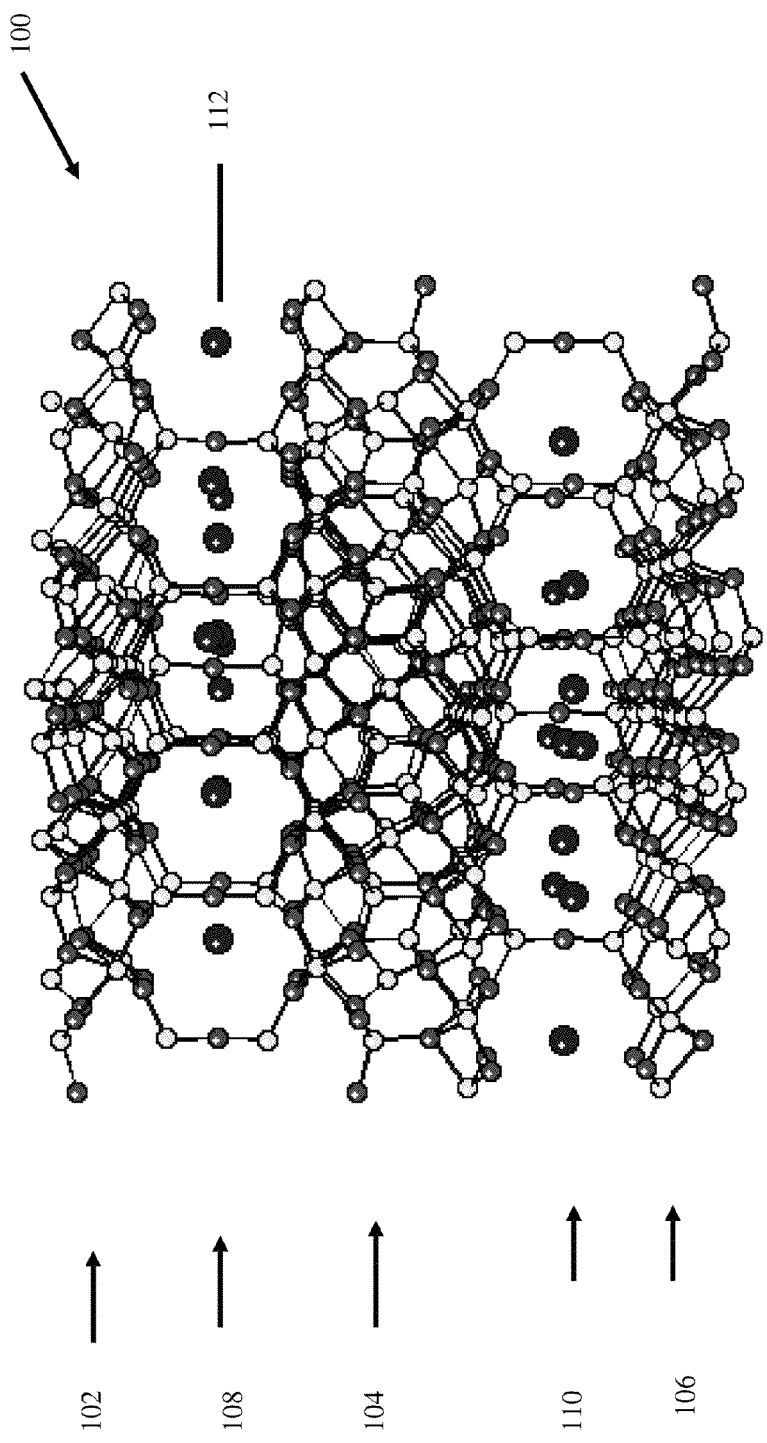
FIG. 1 is a schematic illustration of the crystal structure of sodium beta-Alumina.

An embodiment of a dielectric material 100, for use in electronic and/or electro-optic devices according to some embodiments of the current invention is illustrated schematically in FIG. 1. The dielectric material 100 has a plurality of electrically insulating planes, such as electrically insulating planes 102, 104 and 106, with pluralities of intercalated ions 108, 110 therebetween. For example, one ion of the plurality of intercalated ions 108 between electrically insulating planes 102 and 104 is indicated at reference numeral 112. In FIG. 1, only a small section of the dielectric material 100 is illustrated. Sodium beta-alumina (SBA) is one example of a dielectric material 100 that can be used as a high-dielectric-constant, ionically-polarizable film material according to some embodiments of the current invention. SBA is one example of a layered crystal that that exhibits very high ionic conductivity in two dimensions. (See, for example, Y. Lecars, J. Thery, and Collongu. R, Nonstoichiometry and Stability of Beta' and Beta" Alumina, Comptes Rendus Hebdomadaires Des Seances De L Academie Des Sciences Serie C 274, 4 (1972); H. Nafe, F. Meyer, and F. Aldinger, The equilibrium between Na-beta- and Na-beta"-alumina as a function of the phase composition, Electrochimica Acta 45, 1631 (2000); K. Shqau and H. Nafe, Thermodynamic stability of potassium-beta-alumina, Journal of the American Ceramic Society 88, 2894 (2005); F. Vandecruys, E. Brauns, J. Vangrunderbeek, and R. V. Kumar, Thermodynamic activity of Na2O in Na beta-alumina, Materials Research Bulletin 35, 1153 (2000); Whitting. Ms and R. A. Huggins, Measurement of Sodium Ion Transport in Beta Alumina using Reversible Solid Electrodes, Journal of Chemical Physics 54, 414 (1971); Whitting. Ms and R. A. Huggins, Inherent Transport Properties of Beta-alumina Family, Journal of the Electrochemical Society 119, C109 (1972) for some background information regarding some of these materials.) The conductivity can be observed in powder form (S. Sartori, A. Martucci, A. Muffato, and M. Guglielmi, (2004), p. 911. Contact Free Conductivity of Layered Materials—Na Beta-alumina, Journal of Applied Physics 50, 5761 (1979)) as well as in films, and is of major importance for use as a solid-state electrolyte (U. Strom, P. C.

Taylor, and S. G. Bishop, Electrical-conductivity Spectrum of Na Beta Alumina from 109 to 1013 HZ, Bulletin of the American Physical Society 20, 330 (1975)), particularly for high-temperature battery applications. (J. L. Sudworth, P. Barrow, W. Dong, B. Dunn, G. C. Farrington, and J. O. Thomas, Toward commercialization of the beta-alumina family of ionic conductors, Mrs Bulletin 25, 22 (2000).) Although reference is made to sodium beta alumina as an example throughout this specification, other structures such as sodium beta" alumina (beta double prime alumina) can also be used in other embodiments of the current invention. Furthermore, the general concepts of the current invention are not limited to only these particular examples. Other materials that have electrically insulating planes (in a direction perpendicular to the planes) with intercalated ions therebetween may be used in other embodiments of the current invention.

The ionic conductivity of SBA is due to the motion of sodium ions in the lattice planes, which are separated by a distance of 11.3 Å. At least two regimes of ionic displacement have been identified in layered aluminas (K. Funke and R. D. Banhatti, (2007), p. 1942.), and the ionic conductivity is substantial even through the gigahertz regime. Between the planes are non-conducting spinel-type blocks of Al and O ions, greatly lowering the ionic conductivity in the direction perpendicular to the planes. Furthermore, instead of being high ionic conductor, it's electron conductivity is very poor which implies SBA's dc resistivity is extremely high like alumina. For this reason, a thin layer of SBA may be used as a gate insulator, for example, of a field effect transistor (FET) in an embodiment of the current invention so that it can contribute very small gate leakage current in the transistor characteristics. Additionally, applying a very small gate voltage charge separation between the two surfaces of the gate insulator film may be possible. Using this ion conducting insulator, a low operating voltage FET can be fabricated according to an embodiment of the current invention. These properties arise out of the SBA layered structure, which ensures a very large anisotropy in the ionic conductivity, unlike more three-dimensional ionic conductors or oxides with a degree of electronic conductivity as well. However, the broad concepts of the current invention are not limited to only SBA. Other embodiments of the current invention include other materials that have insulating planes that prevent intercalated ions from moving through the planes while permitting ionic polarizability of the material due to shift of the ions within the interplane regions.

SBA crystal can be synthesized in an embodiment of the current invention by a simple solution approach, i.e by a sol-gel route. First, we prepare a clear gel from which SBA crystal can be prepared according to an embodiment of the current invention. Then this solution can be spin coated over a highly dope Si wafer in one example. After this, the gel derived glass can be annealed at a high temperature to obtain crystalline SAB. In this example, a sufficient time heat treatment was given to obtain a maximum amount of crystal phase.

Figure 2:
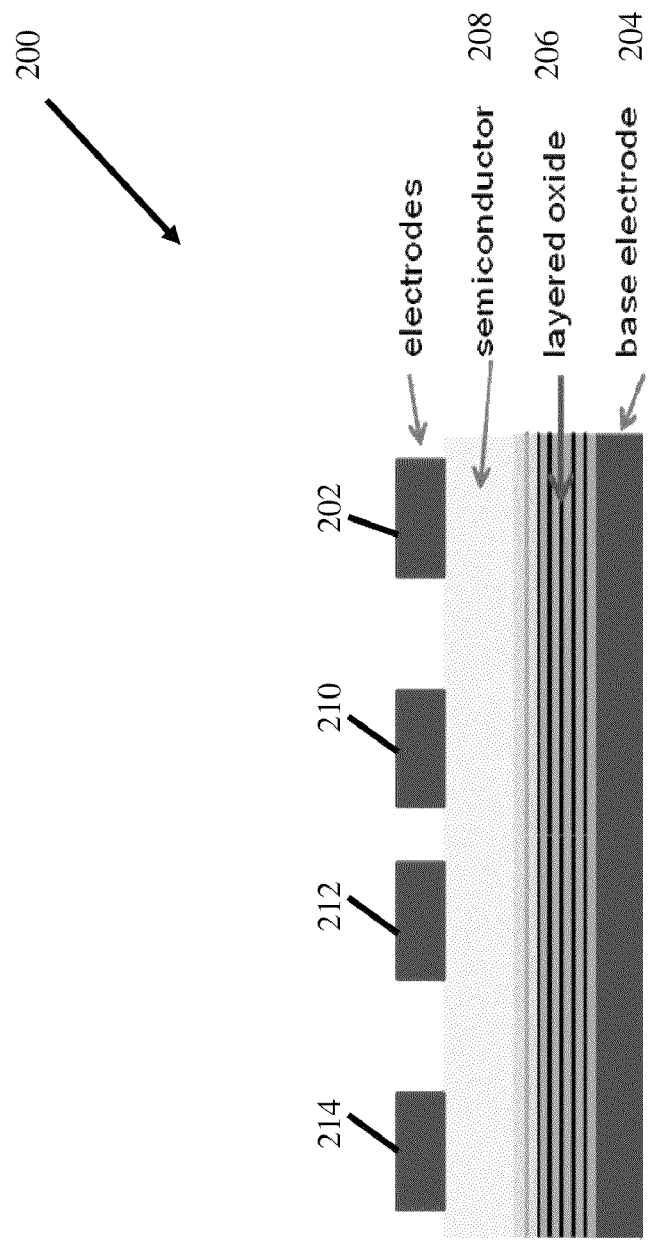
FIG. 2 is a schematic illustration to describe several electronic and/or electro-optic devices according to some embodiments of the current invention. It shows a general sample layout that can also be used for testing layered oxide dielectric-semiconductor oxide bilayers. Individual top electrodes can complete capacitors. Pairs of top electrodes can act as source-drain contacts for FETs. Penetration of the semiconductor part way into the dielectric is possible.

FIG. 2 is a schematic illustration of an electronic or electro-optic device 200 according to an embodiment of the current invention. The electronic or electro-optic device 200 has a first electrode 202, a second electrode 104 spaced apart from the first electrode 202, and a dielectric layer 206 disposed between the first and second electrodes. The dielectric layer 206 has electrically insulating planar layers with intercalated ions therebetween, such as, but not limited to, dielectric material 100. The electrically insulating planar layers provide a barrier to impede movement of the intercalated ions to prevent them from moving to the first and second electrodes 202, 204 under an applied voltage while permitting a polarization of the dielectric layer 206 while the electronic or electro-optic device 200 is being operated. The invention is not limited to the materials selected for the electrodes. The materials for the electrodes can be selected from conventionally available or newly developed materials for electrodes. For example, they can be, but are limited to, transparent electrodes for some applications. Furthermore, the electrodes can be formed on substrates in some embodiments of the current invention. The substrates can be, but are not limited to, transparent substrates in some embodiments of the current invention. For example, glass and/or plastic substrates can be used in some embodiments of the current invention.

In FIG. 2, the electronic or electro-optic device 200 is also illustrated as having a semiconductor layer 208 between the dielectric layer 206 and the first electrode 202. In some embodiments, the semiconductor layer 208 is not present. For example, the electronic or electro-optic device 200 can be a capacitor having only the first and second electrodes 202, 204 such that the first and second electrodes 202, 204 are in contact with the dielectric layer 206. In other embodiments the semiconductor layer can be a hybrid semiconductor-dielectric material in which molecules of the hybrid material have a semiconducting portion and a dielectric portion. The dielectric layer 206 is not limited to any specific number of insulating planes. For example there can be two, three, or more than three insulating planes with intercalated ions therebetween in the dielectric layer 206 according to some embodiments of the current invention. Furthermore, there can be dielectric layers in addition to the dielectric layer 206, such as dielectric layers of conventionally used materials in addition to dielectric layer 206. One particular example, without limitation, could be a case in which the second electrode is formed on a silicon substrate in which the silicon substrate has a thin $SiO_2$ layer. Furthermore, electronic or electro-optic devices 200 according to some embodiments of the current invention can have multiple dielectric and/or multiple semiconductor layers as well as additional layers of material between the first and second electrodes without departing from the general scope of the current invention.

The electronic or electro-optic device 200 can also have a third electrode 210 in some embodiments of the current invention. For example, the electronic or electro-optic device 200 can be a field effect transistor (FET) in some embodiments of the current invention such that the second electrode 104 is a gate electrode and the first and third electrodes 202, 210 are source and drain (or vice versa) electrodes. The electronic or electro-optic device 200 is not limited to two or three electrodes and can have additional electrodes such as electrodes 212 and 214, for example, or even more if desired for the particular application.

The semiconductor layer 208 of the electronic or electro-optic device 200 can be, for example, an n-type or a p-type semiconductor according to some embodiments of the current invention. In other embodiments, the semiconductor layer 208 can be a layer of more than one type of semiconductor such as a p-type and an n-type layer, either in vertical or side-by-side arrangement, to provide a device with a p-n junction.

Solution Processed Oxide-Based Semiconductors

Solution processed semiconductors can be used according to some embodiments of the current invention in addition to the sol-gel processed dielectric materials. ZnO is an example of semiconducting material that can be used according to some embodiments of the current invention. The ZnO semiconducting oxide is a relatively nontoxic n-channel inorganic field effect transistor (FET) semiconductor with high electron mobility (1-10 cm2/Vs), excellent environmental stability, and high transparency. (U. Ozgur, Y. I. Alivov, C. Liu, A. Teke, M. A. Reshchikov, S. Dogan, V. Avrutin, S. J. Cho, and H. Morkoc, A comprehensive review of ZnO materials and devices, Journal of Applied Physics 98 (2005). R. L. Hoffman, B. J. Norris, and J. F. Wager, ZnO-based transparent thin-film transistors, Applied Physics Letters 82, 733 (2003).) Thin films of ZnO semiconductor can be prepared by several solution processes including spin coating, dip coating, hydrothermal process, and sol-gel methods. (J. H. Kim, E. M. Kim, D. Andeen, D. Thomson, S. P. DenBaars, and F. F. Lange, Growth of heteroepitaxial ZnO thin films on GaN-Buffered Al2O3(0001) substrates by low-temperature hydrothermal synthesis at 90 degrees C., Advanced Functional Materials 17, 463 (2007); C. S. Li, Y. N. Li, Y. L. Wu, B. S. Ong, and R. O. Loutfy, ZnO field-effect transistors prepared by aqueous solution-growth ZnO crystal thin film, Journal of Applied Physics 102 (2007); C. S. Li, Y. N. Li, Y. L. Wu, B. S. Ong, and R. O. Loutfy, Performance improvement for solution-processed high-mobility ZnO thin-film transistors, Journal of Physics D-Applied Physics 41 (2008); Y. Natsume and H. Sakata, Zinc oxide films prepared by sol-gel spin-coating, Thin Solid Films 372, 30 (2000); B. J. Norris, J. Anderson, J. F. Wager, and D. A. Keszler, Spin-coated zinc oxide transparent transistors, Journal of Physics D-Applied Physics 36, L105 (2003); B. S. Ong, C. S. Li, Y. N. Li, Y. L. Wu, and R. Loutfy, Stable, solution-processed, high-mobility ZnO thin-film transistors, Journal of the American Chemical Society 129, 2750 (2007); B. N. Pal, J. Sun, B. J. Jung, E. Choi, A. G. Andreou, and H. E. Katz, Pentacene-zinc oxide vertical diode with compatible grains and 15-MHz rectification, Advanced Materials 20, 1023 (2008); B. N. Pal, P. Trottman, J. Sun, and H. E. Katz, Solution-deposited zinc oxide and zinc oxide/pentacene bilayer transistors: High mobility n-channel, ambipolar and nonvolatile devices, Advanced Functional Materials 18, 1832 (2008).) The ZnO film may be formed through a specific thermal treatment of a solution-fabricated ZnO precursor film. By controlling ZnO film thickness, the FET mobility may be controlled. In an exemplary embodiment, FET mobility may be higher than amorphous silicon and other similar ZnO transistor semiconductors in air.

Mixed oxides based on ZnO can have even higher FET mobilities, >10 cm$^2$/Vs, while maintaining transparency. They are deposited from mixed halide solutions. For example, Zinc tin oxide (ZTO) may be prepared by spincoating a solution of the chlorides from acetonitrile and converting the film to oxide by thermal annealing in air. In an embodiment, the field effect mobility was 16 cm$^2$/Vs, with an on/off ratio of 105. (S. Jeong, Y. Jeong, and J. Moon, Solution-processed zinc tin oxide semiconductor for thin-film transistors, Journal of Physical Chemistry C 112, 11082 (2008); Y. J. Chang, D. H. Lee, G. S. Herman, and C. H. Chang, High-performance, spin-coated zinc tin oxide thin-film transistors, Electrochemical and Solid State Letters 10, H135 (2007).) The mobility was similar to that obtained by sputtering. (M. G. McDowell, R. J. Sanderson, and I. G. Hill, Combinatorial study of zinc tin oxide thin-film transistors, Applied Physics Letters 92 (2008).)

In another embodiment, indium zinc oxide (IZO) may be prepared under very similar conditions to yield comparable results. (C. G. Choi, S. J. Seo, and B. S. Bae, Solution-processed indium-zinc oxide transparent thin-film transistors, Electrochemical and Solid State Letters 11, H7 (2008); D. H. Lee, Y. J. Chang, G. S. Herman, and C. H. Chang, A general route to printable high-mobility transparent amorphous oxide semiconductors, Advanced Materials 19, 843 (2007).)

These compounds, as well as more complicated compositions, may also be deposited by inkjet printing the precursor solution. Indium oxide itself was deposited from a solution that included ethanolamine. In an embodiment, the resulting mobility was 44 cm$^2$/Vs and on/off ratio of 106 in a transistor. (H. S. Kim, P. D. Byrne, A. Facchetti, and T. J. Marks, High performance solution-processed indium oxide thin-film transistors, Journal of the American Chemical Society 130, 12580 (2008).) Gallium is an additional element that can be included in these semiconductors in some embodiments of the current invention. (J. K. Jeong, H. J. Chung, Y. G. Mo, and H. D. Kim, Comprehensive study on the transport mechanism of amorphous indium-gallium-zinc oxide transistors, Journal of the Electrochemical Society 155, H873 (2008). W. T. Lim, J. H. Jang, S. H. Kim, D. P. Norton, V. Craciun, S. J. Pearton, F. Ren, and H. Shen, High performance indium gallium zinc oxide thin film transistors fabricated on polyethylene terephthalate substrates, Applied Physics Letters 93 (2008).)

Figure 3:
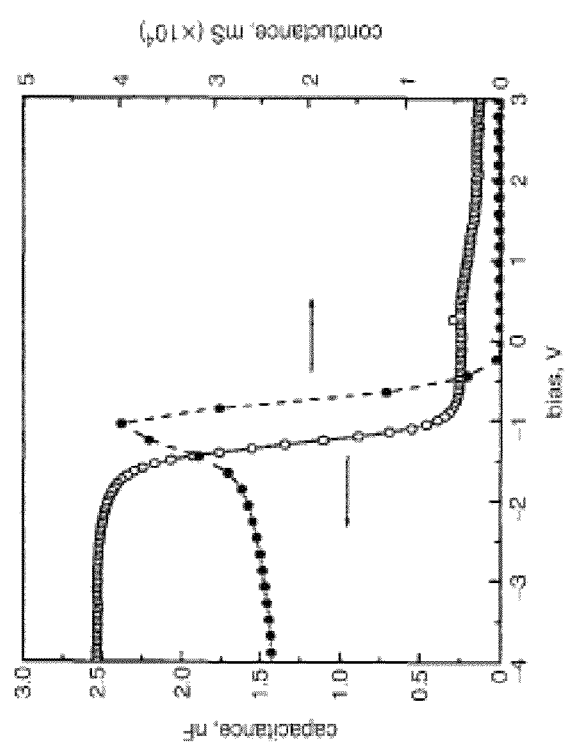
FIG. 3 shows the capacitance (left) and conductance (right) at 1 MHz for an Al/ZnO/Ta$_2$O$_5$/Si capacitor showing tenfold capacitance increase in accumulation. (from Nandi et al.)

Integration of Oxide Semiconductors and Dielectrics for Capacitance Enhancement and Tuning There is very limited work on the use of semiconductors as capacitor electrodes with the deliberate intent to decrease the effective thickness of the dielectric, and thereby increase the capacitance. In transistors, the gate capacitance provides the impetus to form a conductive channel in the semiconductor at the interface with the dielectric. Capacitance-voltage plots reveal the presence of this channel in the form of an altered slope at the threshold voltage, where the channel has just formed and the transistor just reaches the accumulation regime. An example of this phenomenon with oxide materials used ZnO and Ta$_2$O$_5$ as semiconductor and dielectric, respectively (FIG. 3). (S. K. Nandi, W. K. Choi, Y. S. Noh, M. S. Oh, S. Maikap, N. M. Hwang, D. Y. Kim, S. Chatterjee, S. K. Samanta, and C. K. Maiti, Investigations on Ta$_2$O$_5$/ZnO insulator-semiconductor interfaces, Electronics Letters 38, 1390 (2002).) An unusually dramatic increase in capacitance in the accumulation region was observed, correlated with a maximum in the alternating current conductance.

In some metal-insulator-semiconductor structures, an interface layer was present. The interface layer may consist of a mixed phase of semiconductor-derived and dielectric-derived atoms, having a higher conductivity or polarizability than the dielectric phase alone, though most likely with low dielectric strength. In an embodiment, a zirconium silicate interlayer was formed when ZrO$_2$ was deposited on Si, lowering the effective dielectric thickness and raising the specific capacitance. (Y. S. Lin, R. Puthenkovilakam, J. P. Chang, C. Bouldin, I. Levin, N. V. Nguyen, J. Ehrstein, Y. Sun, P. Pianetta, T. Conard, W. Vandervorst, V. Venturo, and S. Selbrede, Interfacial properties of ZrO$_2$ on silicon, Journal of Applied Physics 93, 5945 (2003).) On the other hand, a lower dielectric constant mixed material formed between Si and lanthanum aluminum oxide. (V. Edon, M. C. Hugon, B. Agius, C. Cohen, C. Cardinaud, and C. Eypert, Structural and electrical properties of the interfacial layer in sputter deposited LaAlO3/Si thin films, Thin Solid Films 515, 7782 (2007).) In other embodiments, the interface between an oxide dielectric and a semiconductor substrate is sharp. Zhang et al determined voltage-dependent capacitance of aluminum/zirconium oxide layers on Si at MHz frequencies and designated the minority carriers in the Si as limiting the high frequency capacitance. (N. L. Zhang, Z. T. Song, Q. W. Shen, Y. J. Wu, Q. B. Liu, C. L. Lin, X. Z. Duo, L. R. Zheng, Y. F. Ding, and Z. Q. Zhu, High frequency capacitance-voltage characterization of Al2O3/ZrO2/Al2O3 in fully depleted silicon-on-insulator metal-oxide-semiconductor capacitors, Applied Physics Letters 83, 5238 (2003).) Another group examined capacitance of a mixed La Al oxide dielectric on InGaAs at frequencies up to 1 MHz, with changes in the capacitance-frequency relationship in the inversion region indicating minority carrier participation. (N. Goel, P. Majhi, W. Tsai, M. Warusawithana, D. G. Schlom, M. B. Santos, J. S. Harris, and Y. Nishi, High-indium-content InGaAs metal-oxide-semiconductor capacitor with amorphous $LaAlO_3$ gate dielectric, Applied Physics Letters 91 (2007).) An equivalent dielectric thickness of about 1 nm was shown for Ga/Gd oxide with alumina protection on the same semiconductor. (K. H. Shiu, T. H. Chiang, P. Chang, L. T. Tung, M. Hong, J. Kwo, and W. Tsai, 1 nm equivalent oxide thickness in Ga2O3 (Gd2O3)/In0.2Ga0.8As metal-oxide-semiconductor capacitors, Applied Physics Letters 92 (2008).)

Some embodiments of the current invention can include the concept of forming a mixed interfacial phase between a semiconductor layer and an ionically polarizable solid for enhancing or controlling capacitance.

Some Applications

The use of ionically polarized organic solids as dielectrics can impact a wide range of applications related to electronics and energy generation. For example, an alternative for flexible electrical storage capacitors may be introduced. Pillared alumina capacitors mounted on flexible metal foils can be capable of high electrical energy storage density at elevated temperatures, especially in rolled form, according to some embodiments of the current invention. Mobility-capacitance products of flexible field-effect transistors can lower the voltages at which useful output currents can be obtained while maintaining fast switching ability (mostly dependent on mobility and source-drain separation) according to some embodiments of the current invention. Furthermore, transparent materials may facilitate the manufacture of devices such as display backplanes in some embodiments. Semiconductive oxides may also be useful as optical spacers in organic solar cells, in which thickening of the electron-injecting electrodes with transparent oxides defines incident light wave maxima so that the highest light intensity is coincident with the light-absorbing layers. (J. Y. Kim, S. H. Kim, H. H. Lee, K. Lee, W. L. Ma, X. Gong, and A. J. Heeger, New architecture for high-efficiency polymer photovoltaic cells using solution-based titanium oxide as an optical spacer, Advanced Materials 18, 572 (2006); J. K. Lee, N. E. Coates, S. Cho, N. S. Cho, D. Moses, G. C. Bazan, K. Lee, and A. J. Heeger, Efficacy of TiOx optical spacer in bulk-heterojunction solar cells processed with 1,8-octanedithiol, Applied Physics Letters 92 (2008).) Mixed ZnO-based semiconductors with broader distributions of carrier energies may show increased thermopower compared to homogeneous materials, as electrons will be injected into energy levels associated with impurity atoms, where there are fewer states, and will then be transported within a matrix of majority Zn atoms.

The voltage dependence of the capacitance may be used as a circuit tuning element, for example, to change RC time constants and/or resonant frequencies by applying external voltages to circuits for signal processing. Such tuning is already possible with capacitors that vary in position relative to the rest of the circuit, or have differing fixed capacitance values. (E. Brennan, V. E. Fusco, and A. G. Schuchinsky, Signal frequency identification using anisotropic propagation characteristics of capacitively tuned L-C grids, Electronics Letters 42, 981 (2006); W. Chaivipas, K. Okada, and A. Matsuzawa, Spatial sensitivity of capacitors in distributed resonators and its application to fine and wide frequency tuning digital controlled oscillators, Ieice Transactions on Electronics E91C, 918 (2008); J. M. Drozd and W. T. Joines, A capacitively loaded half-wavelength tapped-stub resonator, Ieee Transactions on Microwave Theory and Techniques 45, 1100 (1997); K. Y. Lee, S. Mohammadi, P. K. Bhattacharya, and L. P. B. Katehi, Compact models based on transmission-line concept for integrated capacitors and inductors, Ieee Transactions on Microwave Theory and Techniques 54, 4141 (2006).) Consequently, some applications of the current invention can provide improvements over such circuits.

EXAMPLE 1

Figure 4:
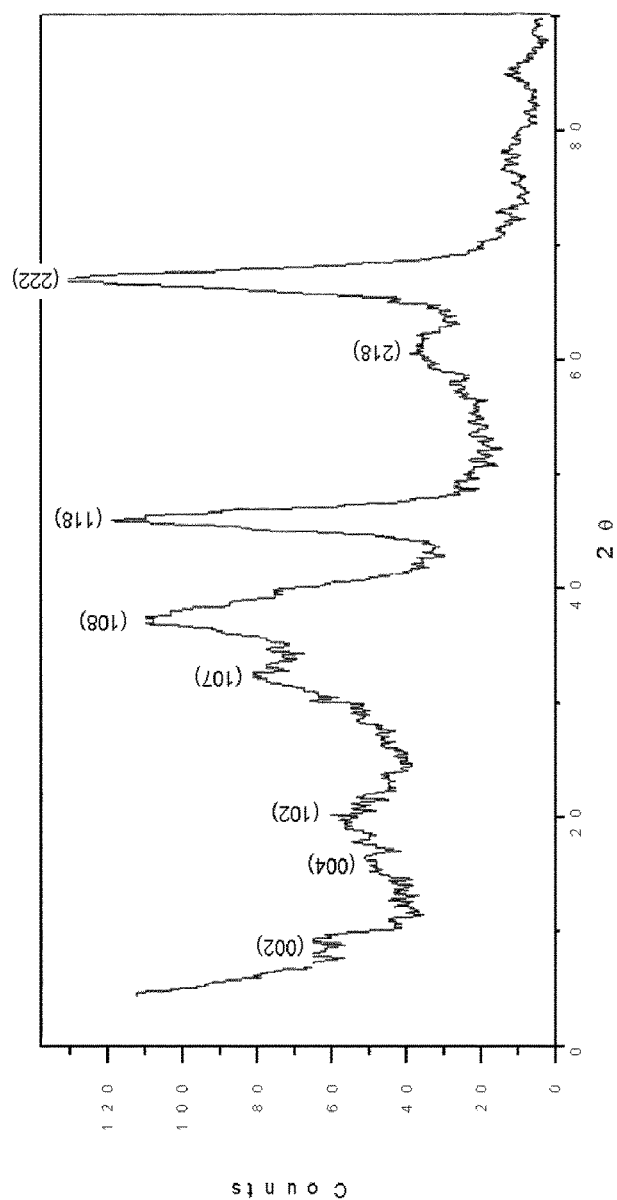
FIG. 4 shows an XRD pattern of the gel-derived SBA powder after annealing at 840° C.

According to an embodiment of the current invention, an SBA film may be created using the following procedure. SBA glass may be synthesized by following the widely cited sol-gel procedure of Yoldas (B. E. Yoldas, Alumina Gels that form Porous Transparent $Al_2O_3$, Journal of Materials Science 10, 1856 (1975); B. E. Yoldas, Transparent Porous Alumina, American Ceramic Society Bulletin 54, 286 (1975); B. E. Yoldas, Alumina Sol Preparation from Alkoxides, American Ceramic Society Bulletin 54, 289 (1975)), but with an additional $Na_2O$ precursor. The target gel composition was $1Na_2O$ to $11 Al_2O_3$. This was chosen so that it can exactly match the formula of SBA crystal. The starting materials were aluminium secondary butoxide $[Al(OC_4H_9)_3]$ and sodium acetate. A measured amount (0.041 mg) of sodium acetate was dissolved in 50 ml water. The solution was heated to 90° C. Aluminium secondary butoxide is a viscous and moisture-reactive liquid, but when it is heated at 90° C., both the viscosity and reactivity are highly reduced. Hence, 1.41 ml $[(Al(OC_4H_9)_3]$ was heated at 90° C. with vigorous stirring. The sodium acetate solution at 90° C. was added to it under continuous stirring. The temperature of this mixture was then increased to 95° C. and kept stirring for half an hour to form an AlO(OH) precipitate. The hydrolysis temperature was the highest temperature that would not lead to violent boiling caused by the exothermic hydrolysis and condensation reactions. In the next step, a dilute mixed acid (0.2N $HNO_3$ and 0.2N HCl, 1:1 ratio) was used in the peptization procedure. In this process acids are added very slowly and ultimately the sol becomes transparent. The sol was kept under continuous stirring at 95° C. for half an hour. With sufficient water removal, the sol become a clear solution and approached the gel point. The clear gel was then filtered through a syringe filter. The filtrate gel was coated over indium tin oxide (ITO)-coated quartz wafers and highly doped silicon wafers. The ITO-coated quartz substrates were dip-coated in the gel solution and dried at 100° C. for one hour. As a result, a continuous layer of glass is formed on the ITO. This gel-derived glass layer was then subjected to high temperature heat treatment for crystallization, in a 750° C. furnace. During a few minutes of treatment, nucleation sites for SBA crystallization are formed. Then the temperature was increased to 850° C. and kept for few minutes more for complete crystallization of SBA. The dip coating and annealing process was then repeated once more, giving a continuous layer of SBA crystal. Similar gel-to-crystallite conversation processes haves been reported by a number of groups. (V. Jayaraman, G. Periaswami, and T. R. N. Kutty, Preparation of potassium beta aluminas by gel-to-crystallite conversion and their characterisation, Journal of Materials Chemistry 8, 1087 (1998); V. Jayaraman, G. Periaswami, and T. R. N. Kutty, Influence of the preparative conditions on the precursor phases formed during the synthesis of beta-alumina by the wet chemical gel to crystallite conversions, Materials Chemistry and Physics 52, 46 (1998).) A powder that we produced by the same process (except for the coating step) gave an x-ray diffraction pattern (FIG. 4) that was indexed to the beta phase. (R. Subasri, T. Mathews, O. M. Sreedharan, and V. S. Raghunathan, Microwave processing of sodium beta alumina, Solid State Ionics 158, 199 (2003).)

SBA was also deposited on n-doped Si wafers, which were first cleaned in pirhana solution to make the surface hydrophilic. Wafers were then spin coated (3000 rpm/30 sec) with gel solution and dried and annealed (one time) as for the ITO substrates. After SBA coating, both types of substrates were then spin coated with dilute (2 times diluted for ITO substrate, and 5 times diluted for $Si^{--}$ substrate) sol and annealed at 150° C. As a result, a thin layer of glassy oxide covered and smoothed the surface. The resulting dielectric layer was suitable for use as a FET gate insulator, as established by atomic force microscopy.

Figure 6:
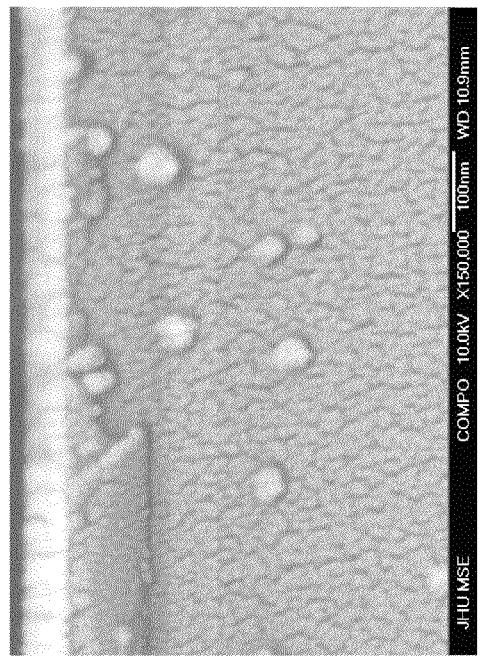
FIG. 6 shows the cross-sectional SEM of SBA (upper lighter colored layer) on a silicon wafer.
Figure 5:
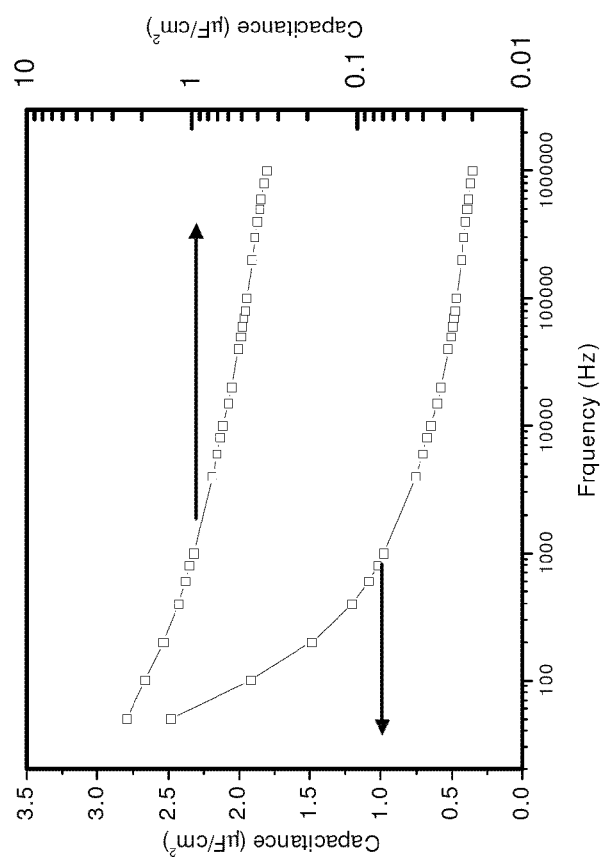
FIG. 5 shows the frequency dependent capacitance (C vs f) of the 75 nm ITO/SAB/Au structure.

FIG. 5 shows Capacitance-Frequency (C-f) measurements of the SAB film carried out on an ITO/SBA/Au structure with a HP 4192A LF impedance analyzer over the frequency range from 50 Hz to 1 MHz. A 75 nm thick layer of SBA film was grown on an ITO coated quartz substrate and Au was used as top electrode. The capacitance of this dielectric layer at 50 Hz is 2.5 $\mu F/cm^2$, which is much greater than that of typical inorganic films. For comparison, a 75 nm thick layer of $SiO_2$ has a capacitance of 38 $nF/cm^2$. The calculated dielectric constant of this SAB film is 211. This value is much higher than alumina dielectric (9.2) and other inorganic high-dielectric materials used in FETs such as $HfO_2$ (25) and $ZrO_2$ (25). (J. Robertson, High dielectric constant oxides, European Physical Journal-Applied Physics 28, 265 (2004).) The SBA film capacitance decreases with frequency as expected, because the ion mobilities limit the polarization response time. However, the capacitance is 350 $nF/cm^2$ at 1 MHz. This implies that high-frequency/low voltage switching of FETs and the RC time constants of circuits should be possible. The film was quite continuous, as shown by the cross-sectional scanning electron micrograph of a film prepared in parallel on a silicon wafer, as illustrated in FIG. 6.

Capacitance in many conventional dielectrics is dominated by charge arriving at and accumulating over the film surfaces, but in the case of sol-gel-derived SBA, the magnitude of the polarization from displacement of $Na^+$ ions may be much larger, leading to much higher capacitance. The freedom of movement of the cations and the short displacement distances perpendicular to the AlO layers ensure that significant capacitance is exhibited even at high frequencies.

Figure 7:
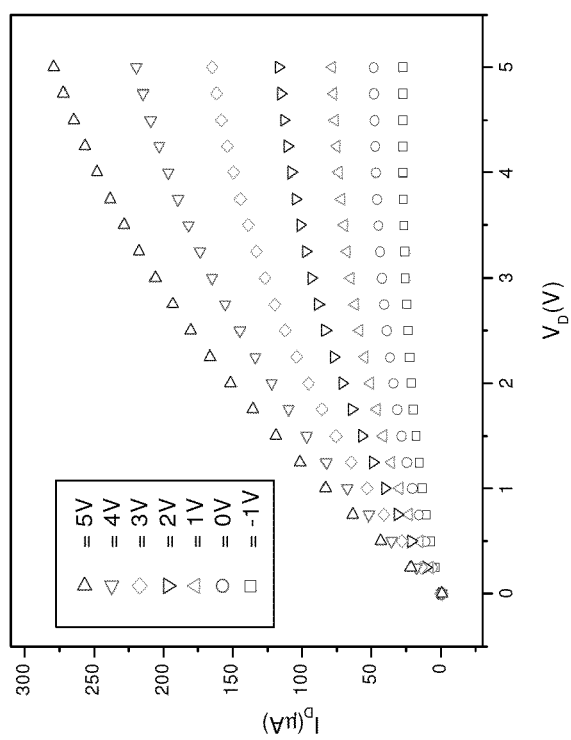
FIG. 7 shows the output characteristics of a ZnO FET with SBA dielectric, with W/L=50.

The high capacitance of SBA may be utilized to lower the operating gate voltage of solution-processed and organic semiconductor-based field-effect transistors (FETs) on Si wafers. FETs that would have required tens of volts to switch on completely may be switched on with single volts. For example, we used ZnO thermally converted from soluble zinc acetate as a semiconductor in the FET embodiment depicted in FIG. 7. The mobility of the ZnO was in the range of 0.1-1 cm2/Vs and the capacitance of the dielectric was 400 $nF/cm^2$. This is one of the higher mobility-capacitance products reported for FETs with solution-deposited active materials. The dielectric strength of the SBA was >1 MV/cm, consistent with low vertical conductivity and low leakage of ions out of the dielectric film into the semiconductor or the contacts.

An even higher capacitance-mobility product may be obtained from an exemplary transistor comprising a solution-processed transparent zinc tin oxide (ZTO) semiconductor deposited over SBA-coated ITO-quartz substrates. The exemplary transistor may be formed in the following manner. A metal halide precursor solution was prepared by dissolving 0.05 M of $ZnCl_2$ and 0.05 M $SnCl_2$ in 25 mL acetonitrile solvent (S. Jeong, Y. Jeong, and J. Moon, Solution-processed zinc tin oxide semiconductor for thin-film transistors, Journal of Physical Chemistry C 112, 11082 (2008); Y. J. Chang, D. H. Lee, G. S. Herman, and C. H. Chang, High-performance, spin-coated zinc tin oxide thin-film transistors, Electrochemical and Solid State Letters 10, H135 (2007)) and mixing by ultrasonicating. SBA dielectric-coated substrate was first kept in NaOH (1M) solution for 10 min to make it hydrophilic, then washed in water and dried in dry nitrogen. The substrate was then dip-coated with this solution at a speed approximately 2 mm/sec with an angle 60° to the horizontal and immediately placed on a 70° C. hot plate. (B. N. Pal, J. Sun, B. J. Jung, E. Choi, A. G. Andreou, and H. E. Katz, Pentacene-zinc oxide vertical diode with compatible grains and 15-MHz rectification, Advanced Materials 20, 1023 (2008).) This process was repeated four times. The coated substrate was inserted into a preheated 600° C. furnace and kept for 15 minutes to form a thin layer of continuous polycrystalline ZTO nanoparticle film. The resultant ZTO film thickness is around 60 nm, confirmed by SEM images. Subsequently, 100 nm-thick aluminum electrodes were deposited using a slim bar TEM grid (200 mesh) as shadow mask. Output characteristics of the device are shown in FIG. 8.

Figure 8:
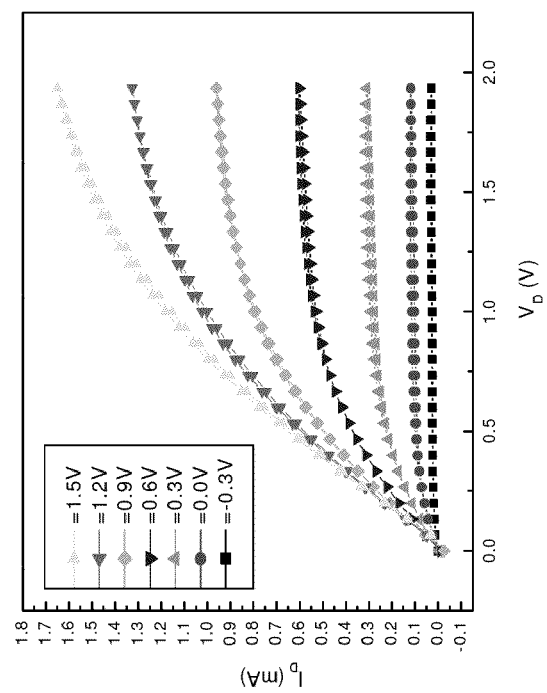
FIG. 8 shows the output characteristic for a ZTO transistor fabricated on ITO quartz substrate with W/L=10.

Specifically, FIG. 8 shows open atmosphere $I_D$-$V_D$ characteristics of a ZTO FET with W/L ratio of 10 (120 $\mu$m/12 $\mu$m). The applied drain voltage ($V_D$) is swept from 0 to 2 V in both forward and reverse directions and gate voltage ($V_G$) is stepped between −0.3 and +1.5 V. This figure shows the clear linear and saturation regions of the output characteristics with very negligible hysteresis. The dielectric breakdown voltage is about 15 V, so there is some latitude to increase voltages further. The ON/OFF ratio of the device is $1 \times 10^3$. The saturated mobility for this device is 24.1 $cm^2$/V-s. For a series of twenty similar devices, the mobility is in the range of 18-29 $cm^2$/Vs, calculated assuming a "1 Hz-frequency" extrapolated capacitance of 3 $\mu F/cm^2$, and with On/Off ratio remaining at $10^3$. The mobility times capacitance/area product of 70 $\mu$F/Vs (ON) is extremely high for a nonsilicon, nonsputtered FET (H. Klauk, U. Zschieschang, and M. Halik, Low-voltage organic thin-film transistors with large transconductance, Journal of Applied Physics 102 (2007)).

Figure 10:
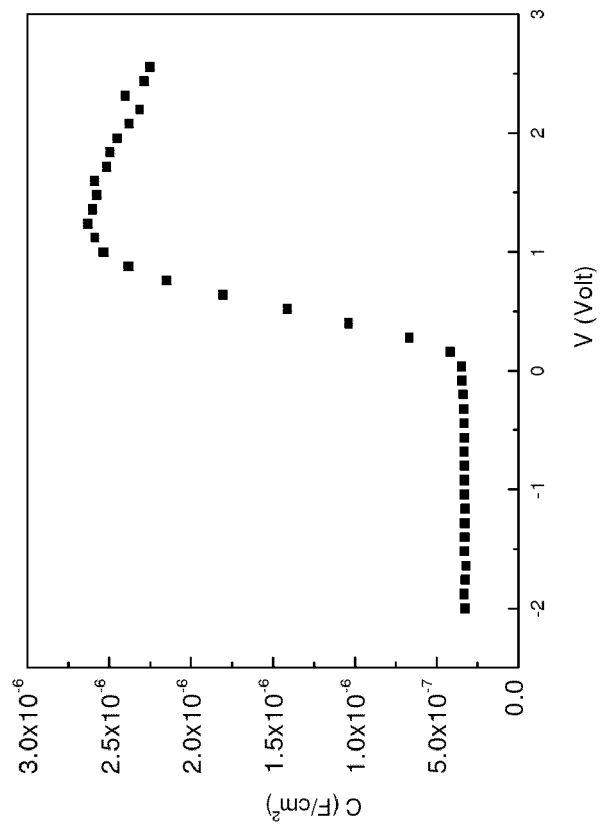
FIG. 10 shows the Capacitance-voltage plot for ITO/SBS/ZTO/Al taken on a transistor with threshold voltage of 0.6 V. The capacitance was measured at 250 Hz.
Figure 9:
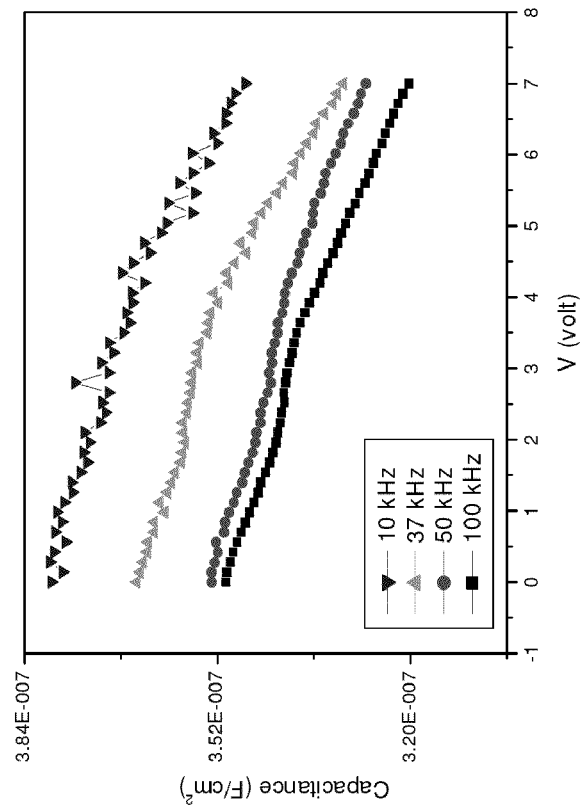
FIG. 9 shows the capacitance-voltage plot for ITO-SBA-Au at four frequencies.

The capacitance of an oxide dielectric-semiconductor bilayer is indeed voltage-dependent. FIG. 9 shows the capacitance as a function of applied DC voltage for a capacitor with the structure ITO-SBA-Au. Of course, ITO is quite conductive and does not really function as a semiconductor. Even so, at four different frequencies between 10 and 100 kHz, the capacitance changes by 10% over an applied voltage range of 7 V. There is little sign of a threshold or turn-on voltage. FIG. 10 shows a C-V plot for a device with ZTO interposed between the dielectric and one contact. There is a clear increase in capacitance at the voltage where a transistor made from the same materials would turn on. The increase is by about a factor of five, indicating significant circuit tuning ability. Use of a thinner dielectric may make the increase even larger.

EXAMPLE 2

According to an embodiment of the current invention, an SBA film was be created using the following procedure. SBA glass may be synthesized by following the widely cited sol-gel procedure of Yoldas (B. E. Yoldas, Alumina Gels that form Porous Transparent AL2O3, Journal of Materials Science 10, 1856 (1975); B. E. Yoldas, Transparent Porous Alumina, American Ceramic Society Bulletin 54, 286 (1975); B. E. Yoldas, Alumina Sol Preparation from Alkoxides, American Ceramic Society Bulletin 54, 289 (1975).) The target gel composition was $1Na_2O$, $11 Al_2O_3$. This was chosen such a way, so that it could exactly mach with formula of SBA crystal. The starting materials were Aluminium Secondary Butoxide [(Al(OC$_4$H$_9$)$_3$] and Sodium Acetate. A measure amount (0.041 mg) of sodium acetate was dissolved in 25 ml water. The solution was heated to 90° C. Aluminium Secondary Butoxide is a viscous and reactive with atmospheric moisture at room temperature. But when it is heated at 90° C., both the viscosity and reactivity are highly reduced. For this reason 1.41 ml [(Al(OC$_4$H$_9$)$_3$] was heated at 90° C. with vigorous stirring. Then Sodium acetate solution of 90° C. was added with it under continuous stirring. Temperature of this mixture was then increased to 95° C. and kept for half an hour under stirring condition for hydrolysis and condensation of aluminium alkoxide to form an AlO(OH) precipitate. The hydrolysis temperature was chosen because of it is the highest temperature compatible with avoiding violent boiling caused by the exothermic hydrolysis and condensation reactions. In the next step, acids (2N HNO$_3$ and 2N HCl, 1:1 ratio) were used in the peptization procedure. In this process acids are added very slowly and ultimately sol becomes transparent. The sol was kept under continuous stifling at 95° C. for half an hour. With sufficient water removal, the sol become a clear solution and approaches the gel point. The clear gel was then filtered by using syringe filter. Then this filtrate gel was spin coated over a highly dope silicon wafer. Then it was dried at 100° C. for one hour. As a result a contentious layer of glass is formed on the Si wafer. This gel derived glass layer was then subjected to high temperature heat treatment for crystallization. For this it was inserted in a high temperature furnace and it temperature was set to 750° C. and kept for few minutes. During this heat treatment number of nucleation site for SBA crystal is formed. Then temperature was increased to 830° C. and kept for few minutes more for complete crystallization of SBA. In this period glass layer is totally converted to a continuous layer of SBA crystal. Now this layer can behave as gate insulator of FET. Then a solution processed zinc oxide FET has been fabricated using SBA coated wafer. For solution processed ZnO films, we used zinc acetate [Zn (OAc)$_2$] (40 mM) and 2-ethanolamine (5 mM) solutions in ethanol as a solvent. The substrate was dip-coated by this solution with a speed approximately 2 mm/sec with an angle 60° to the horizontal and immediately placed on a 70° C. hot plate. This process was repeated two times. The coated substrate was inserted into a preheated 500° C. furnace and kept for 15 minutes to form a thin layer of continuous polycrystalline ZnO nanoparticle film. By using this kind of heat treatment, unidirectional ZnO nanoparticle films can be formed where the c-axis of the ZnO hcp crystal is perpendicular to the substrate. This oriented ZnO film gives a very high field effect mobility. Subsequently, 50 nm-thick aluminum electrodes were deposited using a parallel TEM grid (200 mesh) as shadow mask. Transistor characteristics were obtained using a semiconductor parameter analyzer (Agilent 4155C). All electrical characterization results reported in this specification were done in ambient atmospheric conditions.

Figure 12:
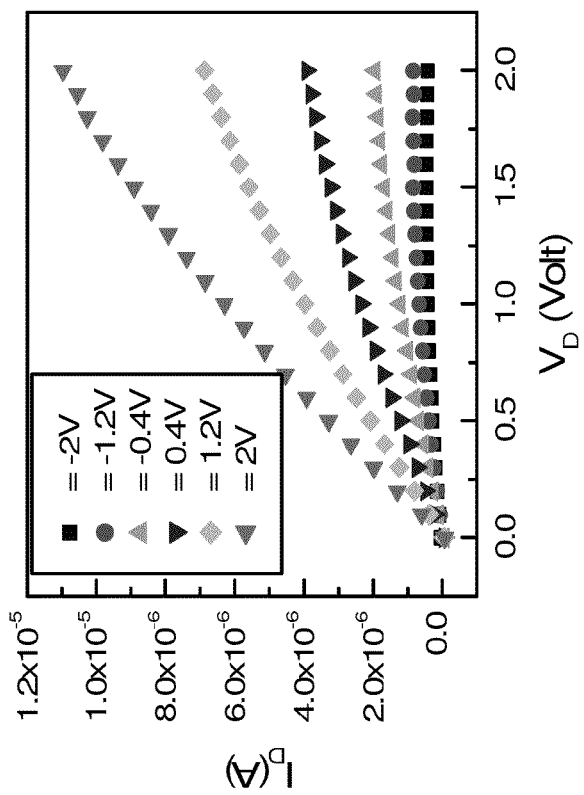
FIG. 11-13 illustrate open atmosphere $I_D$-$V_D$ characteristics of ZnO transistors with a drain voltage of 1V, 2V, and 3V, respectively.
Figure 11:
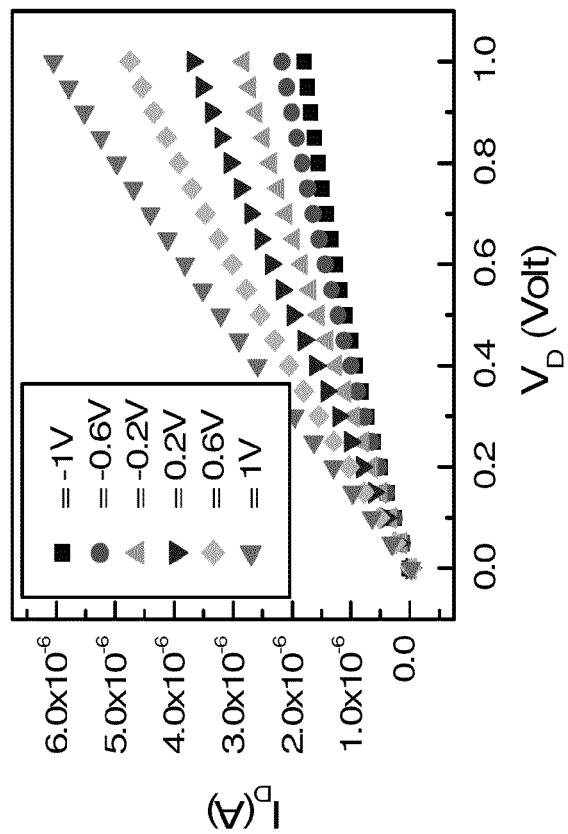
Figure 13:
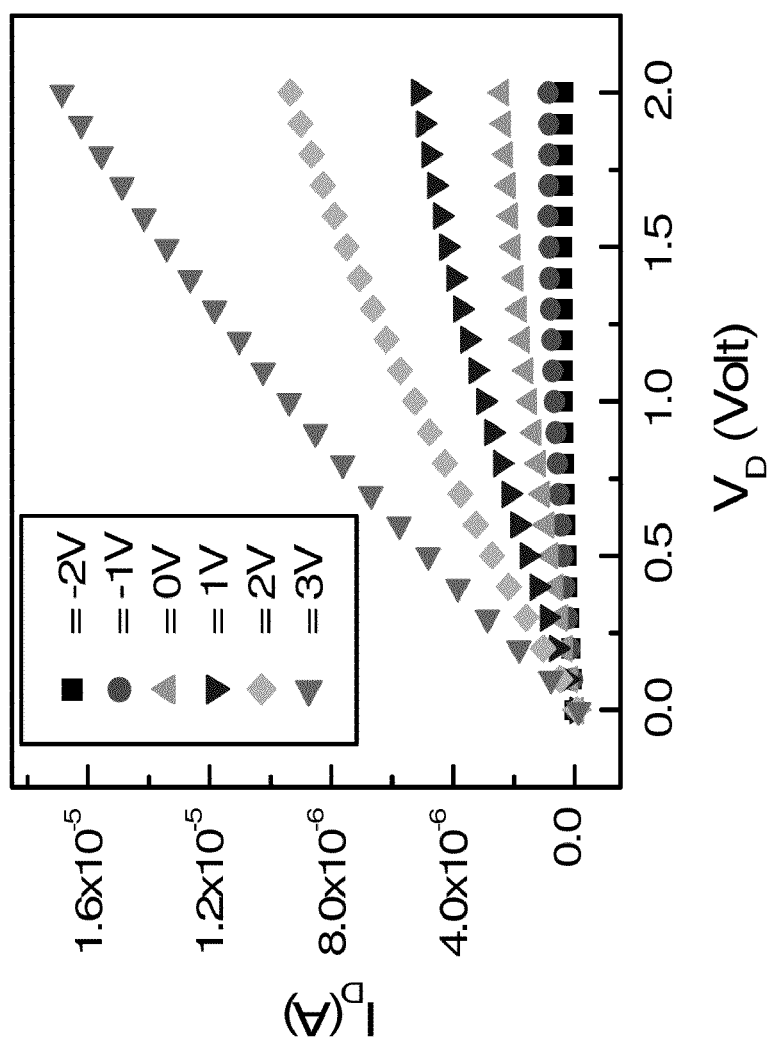
Figure 14:
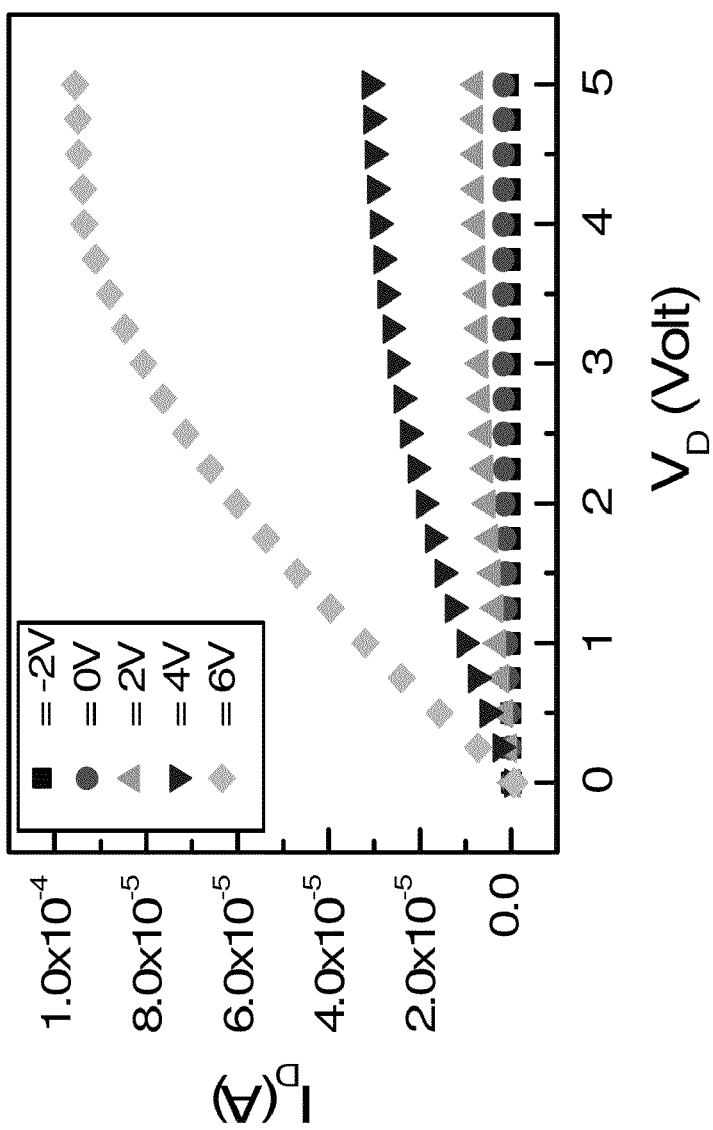
FIG. 14 shows $I_D$-$V_D$ characteristics with higher gate voltage ($V_G$) and drain voltage ($V_D$).

FIG. 11 shows open atmosphere $I_D$-$V_D$ characteristics of ZnO transistors. The applied drain voltage ($V_D$) is 1 V and gate voltage ($V_G$) sweep between −1V to 1V. This figure shows the linear and saturation region of the output characteristics, although the transistor operates in depletion mode with an appreciable drain current at zero gate voltage ($V_G$) and exhibits excellent drain current saturation. Such non-ideal effects are commonly observed in oxide FETs. FIGS. 12 and 13 illustrate the same characteristics of an identical device for different $V_G$ but with $V_D$=2V. From these figures it is very clear that the drain current increase with $V_G$ but 2V drain voltage is sufficient to show clear linear and saturation region of the output characteristics. FIG. 14 shows $I_D$-$V_D$ characteristics with higher gate voltage ($V_G$) and drain voltage ($V_D$). Since the gate insulator is not an ultra thin layer, it may work nicely in higher voltage as well.

Figure 16:
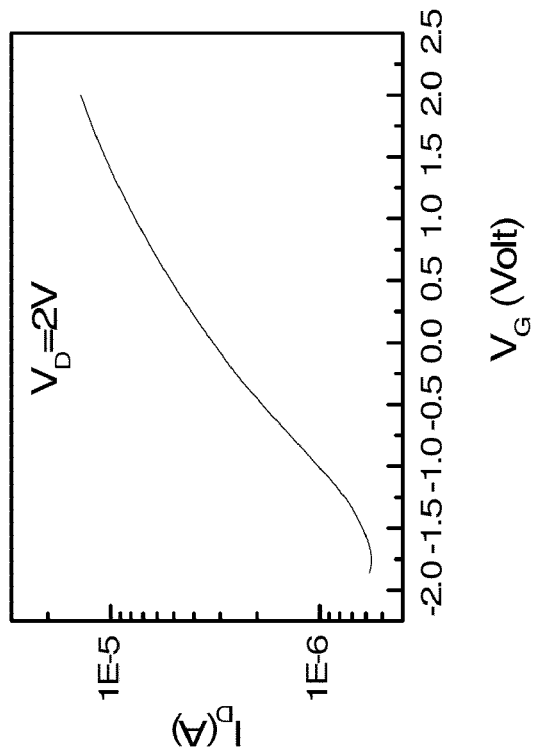
FIG. 16 shows the same transfer characteristics as in FIG. 15, but on a semi-log scale.
Figure 15:
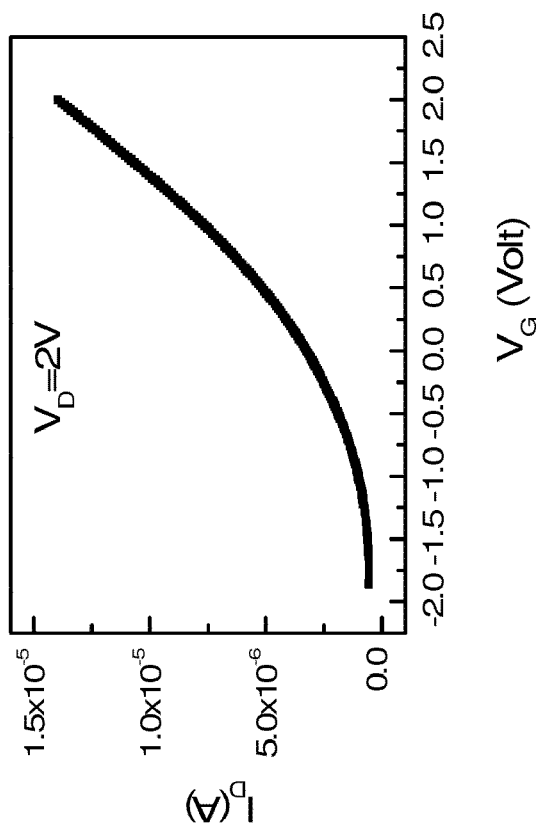
FIG. 15 shows $I_D$-$V_G$ measurements (transfer characteristics) of the ZnO FET with a 20 volt source-to-drain voltage in an ambient atmosphere.

FIG. 15 shows $I_D$-$V_G$ measurements (transfer characteristic) of the ZnO FET with a 20 volt source-to-drain voltage in an ambient atmosphere. The gate-to-source voltage ($V_G$) was swept between −2V to +2V. FIG. 16 shows the same transfer characteristics with semi-log scale. It shows that the ON/OFF ratio of the device is $10 \times 10^2$.

Additional Examples of Ionically Polarizable Oxide Dielectrics

One can vary ions in β-alumina analogues to observe the effect on frequency-dependent dielectric constant, dissipation factor, and dielectric strength, which determine energy density and rate and efficiency of energy release in capacitors, for example. β-alumina dielectrics can be formed with a range of included monovalent, divalent, and trivalent ions, by incorporation into sol-gel precursors or by ion exchange. Versions of β-alumina with a wide variety of intercalated cations are known, including lithium, potassium, calcium, silver, strontium, and lanthanum. (R. Chung and S. W. de Leeuw, Influence of dipolar interactions on the conduction mechanism of Li$^+$-beta-alumina: Molecular Dynamics study, Solid State Ionics 176, 599 (2005); T. Goto, G. He, T. Narushima, and Y. Iguchi, Application of Sr beta-alumina solid electrolyte to a CO2 gas sensor, Solid State Ionics 156, 329 (2003); Y. R. Hong, C. J. Jin, and J. L. Sun, in High-Performance Ceramics 2001, Proceedings, edited by J. P. W. Gong, 2002), Vol. 224-2, p. 183. V. Jayaraman, G. Periaswami, and T. R. N. Kutty, Preparation of lithium B"-alumina by the ion-exchange reaction, Materials Research Bulletin 33, 1811 (1998); O. Kamishima, Y. Iwai, J. Kawamura, and T. Hattori, Defect modes around low-lying phonon in Ag beta-alumina by Raman scattering with high resolution, Solid State Ionics 179, 780 (2008); A. Y. Zhang, T. Akashi, B. P. Zhang, T. Goto, and T. Zhang, Electrical conductivity and ionic transport number of Sr beta-alumina single crystals prepared by a floating zone method, Solid State Ionics 176, 2319 (2005); K. Shqau and H. Nafe, Thermodynamic stability of potassium-beta-alumina, Journal of the American Ceramic Society 88, 2894 (2005); K. Funke and R. D. Banhatti, (2007), p. 1942.) The cations may be present as mixtures, and at varied concentrations. The layered solids can also be examined for their applicability as dielectrics in capacitors or transistors, for example.

The various cations can be incorporated in two ways. The first is to substitute the appropriate oxides for sodium oxide in the sol-gel-based film preparation described above. The second is to simply immerse crystallized films of SBA molten salts (for example, halides and nitrates) containing the desired alternative cations. The rapid diffusion and exchange of cations in SBA under these conditions has been demonstrated for a wide variety of cations, including those mentioned in the preceding paragraph. (S. Sattar, B. Ghosal, M. L. Underwood, H. Mertwoy, M. A. Saltzberg, W. S. Frydrych, G. S. Rohrer, and G. C. Farrington, Synthesis of divalent and trivalent BETA"-ALUMINAS by Ion-exchange, Journal of Solid State Chemistry 65, 231 (1986); G. W. Schafer and W. Weppner, Preparation of Divalent Beta-alumina Ceramics via Ion-exchange from K-ALUMINA AND NA-BETA"-ALUMINA Cermaics, Solid State Ionics 53-6, 559 (1992); F. Tietz and W. Urland, Lanthanide Ion-exchange in Sodium,-BETA-ALUMINA, Solid State Ionics 46, 331 (1991).) To produce larger changes in the dielectric properties, mechanical flexibility, and possibly surface energies and topographies, SBA may be exchanged with organic ions as well.

Layered alumina or other dielectrics that can be prepared at temperatures below those at which "high-temperature" polymers break down can be used for flexible transistors and transistor-based circuits on polymer substrates. However, if annealing temperatures of 700-900° C. are required, then metal foils can be used as substrates for flexible transistor circuits employing the described materials. While processing might not by quite as convenient as for plastic substrates, the eventual components can be usable at significantly elevated temperatures. A process methodology for the use of steel foils for flexible transistors is well developed. (A. Z. Kattamis, N. Giebink, I. C. Cheng, S. Wagner, S. R. Forrest, Y. Hong, and V. Cannella, Active-matrix organic light-emitting displays employing two thin-film-transistor a-Si: H pixels on flexible stainless-steel foil, Journal of the Society for Information Display 15, 433 (2007); M. Wu, X. Z. Bo, J. C. Sturm, and S. Wagner, Complementary metal-oxide-semiconductor thin-film transistor circuits from a high-temperature polycrystalline silicon process on steel foil substrates, Ieee Transactions on Electron Devices 49, 1993 (2002); M. Wu, K. Pangal, J. C. Sturm, and S. Wagner, High electron mobility polycrystalline silicon thin-film transistors on steel foil substrates, Applied Physics Letters 75, 2244 (1999).) These transistors use silicon-based transistors and dielectrics, but the steel platform can be adapted for use with the oxide materials according to some embodiments of the current invention.

This specification described various embodiments of the invention in some detail. For example, combinations of sol-gel processed gate dielectrics and electron-carrying semiconductors can be used in fabricating field-effect transistors that operate in the voltage range of 0.1-10 volts according to some embodiments of the current invention. The dielectrics can be bulk network solids or monolayers, for example. The semiconductors can be inorganic oxides or condensed ring organic compounds in some embodiments. The transistors can be useful for circuits on large-area, irregular, and/or low-melting substrates in some embodiments. Applications can include display backplanes, sensor arrays, flexible amplifiers, and low level memory tags, for example. These devices can also be useful for educational demonstrations and used in educational kits.

Organic and printed circuits are generally tested and operated at voltages in the range of 10-100 V. This is much too high for many applications where power is limited, such as with small batteries or radiofrequency power sources. The high voltages are correlated with thick gate dielectrics that demand high voltages in order to form the charge transport channel at the gate dielectric-semiconductor interface in a field-effect transistor. Thinner gate dielectrics and dielectrics with higher dielectric constant have higher capacitance and therefore require lower voltages to induce the same charge density into the channel. A major challenge for printed electronics is to process gate dielectrics without capital-intensive, slow processes generally associated with silicon technology. High-capacitance gate dielectrics made by printing methods generally suffer from high leakage currents that override the switching action of the transistor. Some embodiments of the current invention can overcome these problems.

In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. An electronic or electro-optic device, comprising:
   a first electrode;
   a second electrode spaced apart from said first electrode;
   a semiconductor layer disposed between said first electrode and said second electrode; and
   a dielectric layer disposed between said first and second electrodes,
   wherein said dielectric layer comprises electrically insulating planar layers with intercalated ions therebetween, said electrically insulating planar layers providing a barrier to impede movement of said intercalated ions to said first and second electrodes under an applied voltage while permitting a polarization of said dielectric layer while in operation.

2. An electronic or electro-optic device according to claim 1, wherein said electrically insulating planar layers are metal-oxide planar layers.

3. An electronic or electro-optic device according to claim 2, wherein said metal-oxide planar layers comprise aluminum oxide.

4. An electronic or electro-optic device according to claim 1, wherein said intercalated ions are sodium ions.

5. An electronic or electro-optic device according to claim 1, wherein said intercalated ions are selected from at least one of sodium, potassium, calcium, silver, strontium and lanthanum ions.

6. An electronic or electro-optic device according to claim 1, wherein said dielectric layer comprises at least one of sodium beta alumina or sodium beta-double-prime alumina.

7. An electronic or electro-optic device according to claim 1, wherein said electronic or electro-optic device is a capacitor.

8. An electronic or electro-optic device according to claim 1, further comprising a third electrode spaced apart from said first and second electrodes such that said dielectric layer and said semiconductor layer are arranged between said third electrode and said second electrode.

9. An electronic or electro-optic device according to claim 8, wherein said electronic or electro-optic device is a field effect transistor.

10. An electronic or electro-optic device according to claim 8, wherein said first and third electrodes are in contact with said semiconductor layer to provide drain and source electrodes, respectively, and said second electrode provides a gate electrode such that said electronic or electro-optic device is a field effect transistor.

11. An electronic or electro-optic device according to claim 8, wherein said semiconductor layer is an n-type semiconductor layer.

12. An electronic or electro-optic device according to claim 11, wherein said n-type semiconductor layer is an inorganic n-type semiconductor layer.

13. An electronic or electro-optic device according to claim 11, wherein said n-type semiconductor layer is an organic n-type semiconductor layer.

14. An electronic or electro-optic device according to claim 1, further comprising a hybrid semiconductor-dielectric layer disposed between said first electrode and said second electrode.

15. An electronic or electro-optic device according to claim 11, further comprising a p-type semiconductor layer disposed between said first and second electrodes in contact with said n-type semiconductor layer to provide an electronic or electro-optic device having a p-n junction.

16. An electronic or electro-optic device according to claim 15, wherein said p-type semiconductor layer is an organic semiconductor layer.

17. An electronic or electro-optic device according to claim 15, wherein said n-type and p-type semiconductor layers are arranged laterally in a side-by-side configuration.

18. An electronic or electro-optic device according to claim 15, wherein said n-type and p-type semiconductor layers are arranged with one layer disposed on top of the other.

19. A method of producing an electronic or electro-optic device, comprising:

providing a first electrode;

providing second electrode spaced apart from said first electrode;

disposing a semiconducting layer between said first electrode and said second electrode; and disposing a dielectric layer between said first and second electrodes, wherein said dielectric layer comprises electrically insulating planar layers with intercalated ions therebetween, said electrically insulating planar layers providing a barrier to impede movement of said intercalated ions to said first and second electrodes under an applied voltage while permitting a polarization of said dielectric layer while in operation.

* * * * *